(12) United States Patent
Enomoto et al.

(10) Patent No.: US 9,236,827 B2
(45) Date of Patent: Jan. 12, 2016

(54) MOTOR DRIVE CIRCUIT, MOTOR DEVICE, AND MOVING VEHICLE

(75) Inventors: Yoichi Enomoto, Shiga (JP); Hiroshi Takao, Osaka (JP); Yoshihiko Maeda, Hyogo (JP); Hoshihito Okada, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 107 days.

(21) Appl. No.: 14/131,651

(22) PCT Filed: May 15, 2012

(86) PCT No.: PCT/JP2012/062377
§ 371 (c)(1),
(2), (4) Date: Jan. 8, 2014

(87) PCT Pub. No.: WO2013/018411
PCT Pub. Date: Feb. 7, 2013

(65) Prior Publication Data
US 2014/0152224 A1    Jun. 5, 2014

(30) Foreign Application Priority Data

Jul. 29, 2011  (JP) .................. 2011-167528

(51) Int. Cl.
| | | |
|---|---|---|
| *G01N 27/04* | (2006.01) | |
| *H02P 27/06* | (2006.01) | |
| *B60L 3/00* | (2006.01) | |
| *G01R 31/40* | (2014.01) | |
| *H02P 29/02* | (2006.01) | |
| *B60L 9/18* | (2006.01) | |
| *G01R 31/34* | (2006.01) | |
| *G01R 31/02* | (2006.01) | |
| *G01R 27/02* | (2006.01) | |

(52) U.S. Cl.
CPC .............. *H02P 27/06* (2013.01); *B60L 3/0069* (2013.01); *B60L 9/18* (2013.01); *G01R 31/34* (2013.01);

(Continued)

(58) Field of Classification Search
CPC ............. G01R 31/1263; G01R 31/343; G01R 31/346; G01R 31/025; G01R 27/025; G01R 27/18; G01R 31/14; G01R 27/16; G01R 31/3606; G01R 31/40; G01R 31/42; G01N 27/04; H02J 1/10
USPC ................ 324/541, 544, 557, 551, 426, 713; 340/647, 667; 318/490; 307/80
See application file for complete search history.

(56) References Cited

U.S. PATENT DOCUMENTS 4,562,390 A * 12/1985 Tobise ................ G01R 31/343
                                                            318/490
4,952,880 A *  8/1990 Clinton ........................ 324/544
(Continued)

FOREIGN PATENT DOCUMENTS

| JP | 06-233450 A   | 8/1994 |
|----|---------------|--------|
| JP | 2008-058088 A | 3/2008 |
| JP | 2010-142073 A | 6/2010 |

OTHER PUBLICATIONS

1 International Search Report, w/ English translation thereof, issued in International Patent Application No. PCT/JP2012/062377 dated Aug. 14, 2012.

*Primary Examiner* — Rita Leykin
(74) *Attorney, Agent, or Firm* — McDermott Will & Emery LLP

(57) ABSTRACT

A motor drive circuit comprises: a DC power supply; power supply lines; an inverter which has upper arm switch elements and lower arm switch elements; and a detection unit for detecting, based on a power state on the previous stage side of the inverter, the insulation resistances of the motor drive circuit and the motor. The detection unit performs a first detection operation for detecting the insulation resistances by using the output of the DC power supply while the upper arm switch elements and the lower arm switch elements are all turned off and a second detection operation for detecting the insulation resistances by using the output of the DC power supply while the elements of one of the upper arm switch elements and the lower arm switch elements are all turned off and at least one of the elements of the other one is turned on.

8 Claims, 5 Drawing Sheets

(52) U.S. Cl.
CPC .............. *G01R 31/40* (2013.01); *H02P 29/021* (2013.01); *G01R 27/025* (2013.01); *G01R 31/025* (2013.01); *G01R 31/343* (2013.01); *Y02T 10/642* (2013.01)

(56) References Cited

U.S. PATENT DOCUMENTS

| | | | |
|---|---|---|---|
| 5,818,236 A * | 10/1998 | Sone et al. | 324/509 |
| 7,253,639 B2 * | 8/2007 | Horikoshi | G01R 31/343 324/551 |
| 7,863,910 B2 * | 1/2011 | Ishii | 324/704 |
| 7,994,779 B2 * | 8/2011 | Ante | G01L 5/103 188/1.11 E |
| 8,022,658 B2 * | 9/2011 | Ide | 318/802 |
| 8,164,344 B2 * | 4/2012 | Yano et al. | 324/510 |
| 8,831,816 B2 * | 9/2014 | Kwon et al. | 701/29.2 |
| 8,860,430 B2 * | 10/2014 | Ishii | G01R 27/025 324/551 |
| 8,981,699 B2 * | 3/2015 | Obata et al. | 318/490 |
| 9,030,205 B2 * | 5/2015 | Kamata et al. | 324/509 |
| 2008/0150549 A1 * | 6/2008 | Horikoshi et al. | 324/557 |
| 2009/0108850 A1 * | 4/2009 | Yamagami et al. | 324/551 |
| 2009/0195205 A1 | 8/2009 | Ide | |
| 2012/0217922 A1 | 8/2012 | Sato et al. | |
| 2013/0221997 A1 * | 8/2013 | Garcia Alvarrez | B60L 3/0069 324/709 |
| 2014/0002091 A1 * | 1/2014 | Edamura et al. | 324/418 |

* cited by examiner

FIG.5

| INSULATION RESISTANCE OF POSITIVE-POLAR LINE | 0 Ω | 20 k Ω | 50 k Ω | 100 k Ω | 1 M Ω | 10 M Ω |
|---|---|---|---|---|---|---|
| VOLTAGE VALUE Vs (V) | 3.83 | 3.19 | 2.69 | 2.28 | 1.55 | 1.44 |

FIG.6

| INSULATION RESISTANCE OF NEGATIVE-POLAR LINE | 0 Ω | 20 k Ω | 50 k Ω | 100 k Ω | 1 M Ω | 10 M Ω |
|---|---|---|---|---|---|---|
| VOLTAGE VALUE Vs (V) | 0.00 | 0.38 | 0.67 | 0.91 | 1.35 | 1.42 |

FIG.7

| INSULATION RESISTANCE OF MOTOR | 0 Ω | 20 k Ω | 50 k Ω | 100 k Ω | 1 M Ω | 10 M Ω |
|---|---|---|---|---|---|---|
| VOLTAGE VALUE Vs (V) | 0.00 | 0.38 | 0.67 | 0.91 | 1.35 | 1.42 |

FIG.8

| INSULATION RESISTANCE OF MOTOR | 0 Ω | 20 k Ω | 50 k Ω | 100 k Ω | 1 M Ω | 10 M Ω |
|---|---|---|---|---|---|---|
| VOLTAGE VALUE Vs (V) | 3.83 | 3.19 | 2.69 | 2.28 | 1.55 | 1.44 |

MOTOR DRIVE CIRCUIT, MOTOR DEVICE, AND MOVING VEHICLE

RELATED APPLICATIONS

This application is the U.S. National Phase under 35 U.S.C. §371 of International Application No. PCT/JP2012/062377, filed on May 15, 2012, which in turn claims the benefit of Japanese Application No. 2011-167528, filed on Jul. 29, 2011, the disclosures of which Applications are incorporated by reference herein.

TECHNICAL FIELD

The present invention relates to a motor drive circuit, a motor device, and a moving vehicle.

BACKGROUND ART

Conventionally, a motor drive circuit is proposed which allows detection (leak current detection) of insulation resistance. Besides, a patent document 1 discloses a circuit that drives a motor of an electric vehicle and detects an insulation resistance of the motor.

CITATION LIST

Patent Literature

PLT1: JP-A-2010-142073

The circuit disclosed in the patent document 1 is a circuit that detects the insulation resistance of the motor, but does not detect an insulation resistance of the motor drive circuit. In light of the above problem, it is an object of the present invention to provide a motor drive circuit that allows the detection of the insulation resistance of each of the motor drive circuit and the motor. Besides, it is also an object of the present invention to provide a motor device and a moving body that include the motor drive circuit.

Solution to Problem

To achieve the object, a motor drive circuit according to the present invention includes: a DC power supply; power supply lines connected to the DC power supply; and an inverter which has a group of at least one upper arm switch device and another group of at least one lower arm switch device of one phase or of a plurality of phases connected in series between the power supply lines, and to which a motor is connected between the upper arm switch device and the lower arm switch device; the motor drive circuit includes a detection portion that detects insulation resistances of the motor drive circuit and the motor based on a power state on a previous stage with respect to the inverter, wherein the detection portion has a structure to perform: a first detection operation for detecting the insulation resistance by using an output from the DC power supply in a state where all of the upper arm switch devices and all of the lower arm switch devices are kept in an off-state; and a second detection operation for detecting the insulation resistance by using the output from the DC power supply in a state where all of the upper arm switch devices of the one group or all of the lower arm switch devices of the other group are kept in the off-state and at least one of the upper arm switch devices of the one group or at least one of the lower arm switch devices of the other group is kept in an on-state.

According to the present structure, it becomes possible to detect the insulation resistance of each of the motor drive circuit and the motor. In the meantime, the insulation resistance detection is not limited to a form of detecting a value itself of the insulation resistance but is a concept that also covers a form (form of detecting whether the insulation resistance is good or not) as well in which it is detected normal in a case where the insulation resistance is larger than a predetermined threshold value and it is detected defective in a case where the insulation resistance is smaller than the predetermined threshold value.

Advantageous Effects of Invention

In the motor drive circuit according to the present invention, it becomes possible to detect the insulation resistance of each of the motor drive circuit and the motor.

BRIEF DESCRIPTION OF DRAWINGS

[FIG. 5] is a table related to a relationship between an insulation resistance of a positive-polar line and a voltage value Vs.

[FIG. 6] is a table related to a relationship between an insulation resistance of a negative-polar line and a voltage value Vs.

[FIG. 7] is a table related to a relationship between an insulation resistance of a motor and a voltage value Vs.

[FIG. 8] is a table related to a relationship between an insulation resistance of a motor and a voltage value Vs.

DESCRIPTION OF EMBODIMENTS

As to embodiments of the present invention, each of a first embodiment to a third embodiment is described as an example hereinafter.

1. First Embodiment

[Structure and the Like of Motor Drive Circuit]

Figure 1:
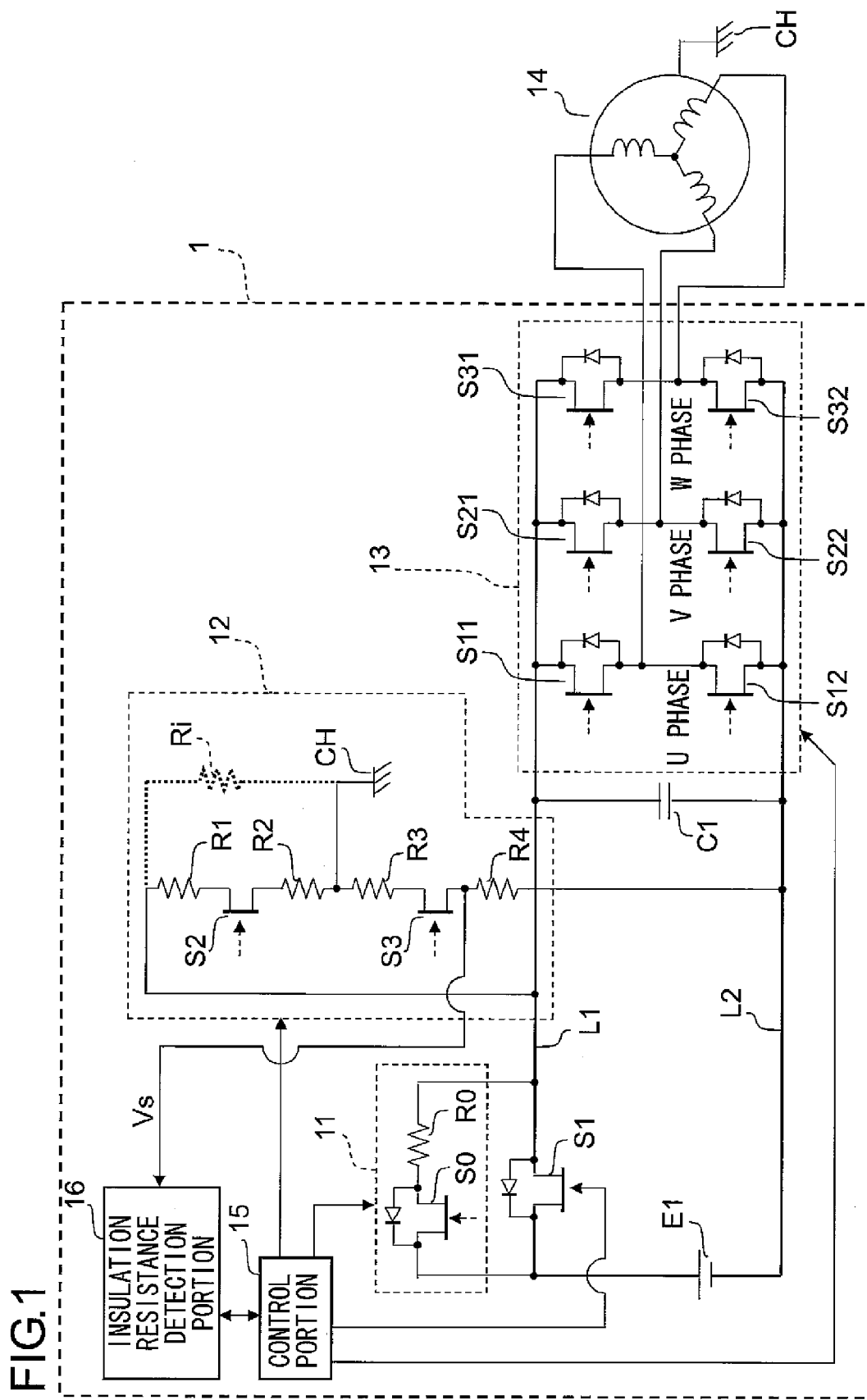
[FIG. 1] is a structural view of a motor drive circuit according to an embodiment of the present invention.

First, a first embodiment is described. FIG. 1 is a structural view of a motor drive circuit 1 according to the present embodiment. The motor drive circuit 1 has: a pre-charge circuit 11; a voltage division circuit 12; an inverter 13; a control portion 15; an insulation resistance detection portion 16; a DC power supply E1; a switch device S1; a power supply smoothing capacitor C1 and the like. Besides, a motor 14 is connected to the motor drive circuit 1 and forms a motor device as a whole.

In the meantime, the motor device is disposed in electric vehicles (e.g., an electric bicycle, a motorcycle, a motor tricycle, a four-wheeled vehicle and the like) that are a form of moving body. Besides, each switch device in the embodiments of the present invention switches on/off (conduction/non-conduction between both ends) in accordance with a control signal output from the control portion 15. As each switch device, for example, an FET and an IGBT are employable, but these are not limiting.

Besides, a positive pole of the DC power supply E1 and an upper arm switch device (switch device that plays a role of an upper arm) of the inverter circuit 13 are connected to each other by means of a positive-polar line L1 (positive-polar power supply line), while a negative pole of the DC power supply E1 and a lower arm switch device (switch device that plays a role of a lower arm) of the inverter circuit 13 are connected to each other by means of a negative-polar line L2 (negative-polar power supply line). In the meantime, in the following description, the words "between power lines" mean being between the positive-polar line L1 and the negative-polar line L2. Besides, there is a case where the positive-polar line L1 and the negative-polar line L2 are collectively called a "power supply line." Besides, in the motor drive circuit 1, a "previous stage" refers to a stage near to the DC power supply E1, while a "post stage" refers to a stage near to the motor 14.

The switch device S1 is disposed on the positive-polar line L1. In other words, one end is connected to the positive pole of the DC power supply E, while the other end is connected to the upper arm switch device of the inverter 13. Besides, both ends of the switch device S1 are connected to each other via a diode (the cathode faces the positive pole of the DC power supply E1). The switch device S1 functions as a main switch of the motor drive circuit 1.

The pre-charge circuit 11 is a circuit for pre-charging the power supply smoothing capacitor C1 disposed between the power supply lines and is connected to the positive-polar line L1 in parallel with the switch device S1. The pre-charge circuit 11 has a switch device S0 and a resistor R0. As to the switch device S0, one end is connected to a point between the positive pole of the DC power supply E and the switch device S1, while the other end is connected to one end of the power supply smoothing capacitor C1 via the resistor R0.

The voltage division circuit 12 is a circuit that is used to detect whether an insulation resistance (which refers to an insulation resistance between the motor drive circuit 1 and a chassis of an electric vehicle) of the motor drive circuit 1 and disposed between the power supply lines. The voltage division circuit 12 has switch devices (S2, S3) and resistors (R1 to R4).

As to the resistor R1, one end is connected to the positive-polar line L1, while the other end is connected to one end of the resistor R2 via the switch device S2. Besides, the other end of the resistor R2 is connected to one end of the resistor R3. Besides, as to the resistor R4, one end is connected to the other end of the resistor R3 via the switch device S3, while the other end is connected to the negative-polar line L2.

In the meantime, a point between the resistor R2 and the resistor R3 is connected to a chassis CH of the electric vehicle. Beside, a point between the resistor R4 and the switch device S3 is connected to the insulation resistance detection portion 16. According to this, when the switch devices (S2, S3) are in an on-state, the insulation resistance detection portion 16 is able to detect a voltage value Vs obtained by dividing a voltage between the power supply lines by means of the resistors (R1 to R4). In the meantime, in the present embodiment, one end of the voltage division circuit 12 is connected to a point on a post stage side (a point distant from the DC power supply E1) with respect to the switch device S1 on the positive-polar line L1, but may be connected to a point on a previous stage side with respect to the switch device S1.

The inverter 13 receives a DC voltage supplied from the DC power supply E1, converts this DC voltage into a three-phase AC voltage and outputs the three-phase AC voltage to the motor 14. The inverter 13 has three-phase arms that include a U phase arm, a V phase arm, and a W phase arm. The U phase arm, the V phase arm, and the W phase arm are connected between the power supply lines in parallel with each other. In the meantime, as the inverter 13, an inverter other than the three-phase inverter may be used.

The U phase arm has: switch devices (S11, S12) connected in series between the power supply lines; and diodes connected in parallel with the switch devices (S11, S12). As to any diode, a cathode is disposed to face the positive-polar line L1, while an anode is disposed to face the negative-polar line L2. In the meantime, the switch device S11 corresponds to an upper arm switch device of the U phase, while the switch device S12 corresponds to a lower arm switch device of the U phase.

The V phase arm has: switch devices (S21, S22) connected in series between the power supply lines; and diodes connected in parallel with the switch devices (S21, S22). As to any diode, a cathode is disposed to face the positive-polar line L1, while an anode is disposed to face the negative-polar line L2. In the meantime, the switch device S21 corresponds to an upper arm switch device of the V phase, while the switch device S22 corresponds to a lower arm switch device of the V phase.

The W phase arm has: switch devices (S31, S32) connected in series between the power supply lines; and diodes connected in parallel with the switch devices (S31, S32). As to any diode, a cathode is disposed to face the positive-polar line L1, while an anode is disposed to face the negative-polar line L2. In the meantime, the switch device S31 corresponds to an upper arm switch device of the W phase, while the switch device S32 corresponds to a lower arm switch device of the W phase.

The motor 14 is a three-phase permanent magnet synchronization motor that moves a predetermined portion (as an example, a wheel) of the electric vehicle and is driven by the three-phase AC voltage input from the inverter 13. The motor 14 is provided with coils each of which corresponds to each phase, and one end of each coil is connected to: a point between the upper arm switch device and lower arm switch device of the U phase; a point between the upper arm switch device and lower arm switch device of the V phase; and a point between the upper arm switch device and lower arm switch device of the W phase. Besides, the other ends of the respective coils are connected to each other in the motor 14.

The control portion 15 is capable of outputting a control signal to perform control of on/off switchovers of the respective switch devices (S0 to S3, S11, S12, S21, S22, S31, S32) and controls each operation of the motor drive circuit 1 in accordance with a predetermined procedure. In the meantime, one of the operations performed by the motor drive circuit 1 is an insulation resistance detection operation for detecting whether the insulation resistance of the motor drive circuit 1 is good or not. Details of the insulation resistance detection operation are described later.

When the insulation resistance detection operation is performed, based on information of the voltage value Vs, the insulation resistance detection portion 16 detects whether the insulation resistance is good or not. In the meantime, by detecting the insulation resistance, it becomes possible to detect an electrical leak. A method for detecting whether the insulation resistance is good or not becomes apparent from later description.

[Insulation Resistance Detection Operation]

Figure 2:
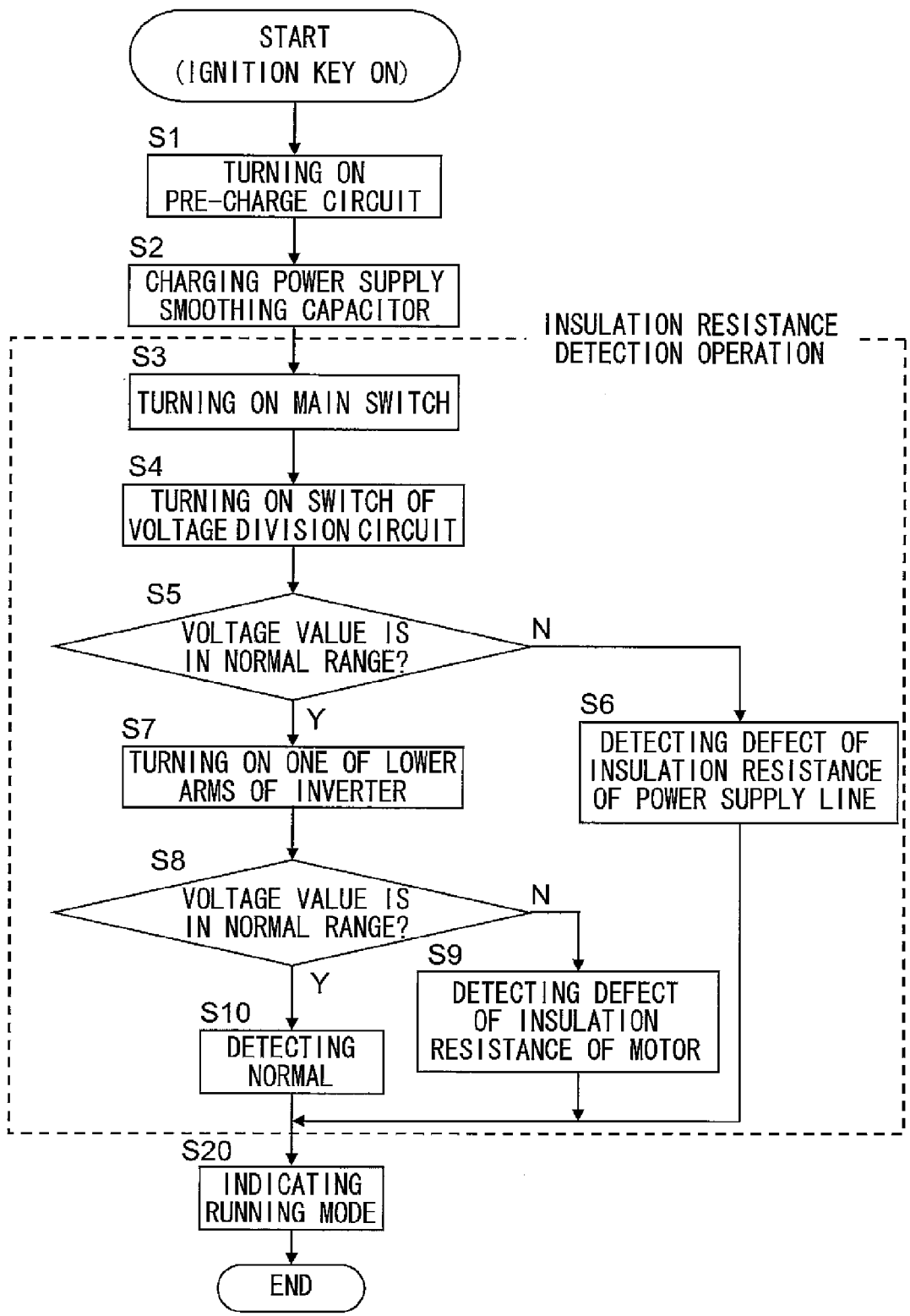
[FIG. 2] is a flow chart related to operation in a startup mode according to a first embodiment.

When an ignition key is turned on, the electric vehicle according to the present embodiment goes to a running mode via a startup mode. And the motor drive circuit 1 performs the insulation resistance detection operation in this startup mode. Next, a flow of the operation performed by the motor drive circuit 1 in the startup mode is described with reference to a flow chart shown in FIG. 2.

When the ignition key is turned on, the control portion 15 turns on the switch device S0 and turns on the pre-charge circuit 11 (step S1). According to this, the power supply smoothing capacitor C1 is pre-charged (step S2).

And after the pre-charging of the power supply smoothing capacitor C1 is completed, the insulation resistance detection operation (steps S3 to S10 described later) is performed. Specifically, it is as follows. The control portion 15 turns on the switch device S1 (main switch) (step S3). Because of the operation described so far, the power supply lines are connected to the DC power supply E1, and the voltage between the power supply lines becomes the voltage of the DC power supply E1. In the meantime, on this stage, the switch devices of the voltage division circuit 12 and inverter 13 are all in an off-state.

And the control portion 15 turns on the switch devices (S2, S3) of the voltage division circuit 12 (step S4). According to this, a state is obtained where the positive-polar line L1 is connected to the chassis CH via the resistor R1 and the resistor R2, while the negative-polar line L2 is connected to the chassis CH via the resistor R3 and the resistor R4. In the meantime, in this state, the switch devices of the inverter 13 are all in the off-state; accordingly, the motor 14 is not connected to the DC power supply E1 yet.

In this state, the insulation resistance detection portion 16 determines whether the voltage value Vs is in a normal range or not (step S5). This determination operation is an operation for detecting whether the insulation resistance is good or not as to the power supply line (a portion on the previous stage with respect to the inverter 13 of the motor drive circuit 1).

Here, the insulation resistance of the positive-polar line L1 corresponds to a resistor Ri of an equivalent circuit shown by a dotted line in FIG. 1, and the smaller this insulation resistance is, the larger the voltage value Vs becomes. As to the insulation resistance of the negative-polar line L2, the smaller the insulation resistance is, the smaller the voltage value Vs becomes.

Besides, when the voltage of the DC power supply E1 is 50 V, the resistance value of the resistor R1 is 68 kΩ, the resistance values of the resistor R2 and resistor R3 are each 82 kΩ, and the resistance value of the resistor R4 is 6.8 kΩ (hereinafter, this condition is called a "reference condition"), a relationship between the insulation resistance of the positive-polar line L1 and the voltage value Vs is as shown in a table of FIG. 5 (provided that deterioration in the insulation resistance of the negative-polar line L2 is negligible). According to the table of FIG. 5, for example, in a case where the insulation resistance of the positive-polar line L1 is 50 kΩ, the voltage value Vs becomes 2.69 V.

Besides, under the reference condition, a relationship between the insulation resistance of the negative-polar line L2 and the voltage value Vs is as shown in a table of FIG. 6 (provided that deterioration in the insulation resistance of the positive-polar line L1 is negligible). According to the table of FIG. 6, for example, in a case where the insulation resistance of the negative-polar line L2 is 50 kΩ, the voltage value Vs becomes 0.67 V.

It is clear from FIG. 5 and FIG. 6 that for example, in a case where the defect detection threshold value for the insulation resistance is set at 50 kΩ, that is, in a case where the insulation resistance is determined defective when the insulation resistance is under 50 kΩ, a range of 0.67 V to 2.69 V becomes a normal range of the voltage value Vs. If the voltage value Vs is in the normal range, the insulation resistance is normal (i.e., an electrical leak does not occur); if the voltage value Vs is outside the normal range (when being under 0.67 V or exceeding 2.69 V), the insulation resistance is defective (i.e., an electrical leak occurs). Information of such normal range is stored beforehand in the insulation resistance detection portion 16.

In the case where the voltage value Vs is outside the normal range (N in the step S5), the insulation resistance detection portion 16 detects that the insulation resistance of the power supply line is defective (step S6). This detection result is conveyed to the control portion 15, and the insulation resistance detection operation ends.

On the other hand, in the case where the voltage value Vs is in the normal range (Y in the step S5), this detection result is conveyed to the control portion 15. At this time, the control portion 15 turns on one of the lower arm switch devices (S12, S22, S32) of the inverter 13 with the switch devices (S1 to S3) kept in the on-state (step S7). In the meantime, at this time, the upper arm switch devices (S11, S21, S31) are all kept in the off-state. According to this operation, a state is obtained where the motor 14 is connected to the negative pole of the DC power supply E1 via the turned-on switch device.

In this state, the insulation resistance detection portion 16 determines whether the voltage value Vs is in the normal range or not (step S8). This determination operation is an operation for detecting whether the insulation resistance is good or not as to the motor 14 (a portion on the post stage with respect to the inverter 13 of the motor drive circuit 1). Here, the smaller the insulation resistance of the motor 14 becomes, the smaller the voltage value Vs becomes.

Besides, under the reference condition described above, a relationship between the insulation resistance of the motor 14 and the voltage value Vs is as shown in a table of FIG. 7. According to the table of FIG. 7, for example, in a case where the insulation resistance of the motor 14 is 50 kΩ, the voltage value Vs becomes 0.67 V.

It is clear from FIG. 7 that for example, in a case where the defect detection threshold value for the insulation resistance is set at 50 kΩ, a range of 0.67 V or higher becomes a normal range of the voltage value Vs. If the voltage value Vs is in the normal range, the insulation resistance is normal, while if the voltage value Vs is outside the normal range (when being under 0.67 V), the insulation resistance is defective. Information of such normal range is stored beforehand in the insulation resistance detection portion 16.

In the meantime, it is already confirmed through the operation of the step S5 that the insulation resistance of the power supply line is normal. Because of this, if it is detected by the operation of the step S8 that the voltage value Vs is outside the normal range, it is sayable that the insulation resistance of the motor 14 is defective.

In the case where the voltage value Vs is outside the normal range (N in the step S8), the insulation resistance detection portion 16 detects that the insulation resistance of the motor 14 is defective (step S9). This detection result is conveyed to the control portion 15, and the insulation resistance detection operation ends.

On the other hand, in the case where the voltage value Vs is in the normal range (Y in the step S8), it is sayable that the insulation resistance is normal in both the power supply line and the motor 14. Because of this, in this case, the insulation resistance detection portion 16 detects that the insulation resistance of the motor drive circuit 1 is normal (step S10). This detection result is conveyed to the control portion 15, and the insulation resistance detection operation ends.

As to the insulation resistance determination of the motor device, as described above, the insulation resistance detection operation detects one of: (1) normal; (2) defective at the motor 14; and (3) defective at the power supply line (i.e., the motor drive circuit 1). As described above, according to the insulation resistance detection operation, it is possible to detect whether the insulation resistance of the motor device is good or not, and it is possible to locate a defective portion of the insulation resistance.

In the meantime, after the insulation resistance detection operation is completed, the control portion 15 performs a running mode indication (indication for representing that the running mode begins) by means of an indication device (e.g., a lamp, a display) (step S20) disposed in the electric vehicle. According to this, a user knows that the electric vehicle becomes able to run. At the stage where the running mode indication is performed, the startup mode ends.

Besides, after the insulation resistance detection operation is completed, the control portion 15 performs an operation in accordance with the detection result. For example, in a case where the electric vehicle is provided with an indication device (as an example, three kinds of lamps corresponding to the respective detection results of (1) to (3)) for indicating the detection result of the insulation resistance detection operation, the control portion 15 conveys the detection result to the user by performing control of the indication devices.

As described above, it is preferable that the insulation resistance detection operation is performed during the startup mode from the time the ignition key is turned on to the time the running mode begins. However, the timing and the like for performing the insulation resistance detection operation are not limited to the above embodiment.

[Switchover of Arms to be Turned on]

In the meantime, when detecting whether the insulation resistance of the motor 14 is good or not (step S8 to step S10), the above operation of the step S7 is the operation for connecting the negative pole of the DC power supply E1 to the motor 14 by turning on one of the lower arm switch devices. Because of this, a period (called an "arm on period" for the sake of convenience) for keeping one of the lower arm switch devices in the on-state is set in a period in which at least the power of the DC power supply E1 reaches the motor 14 and it becomes possible to detect whether the insulation resistance is good or not.

Besides, in the operation of the step S7, by turning on the lower arm switch device of any one of the U phase to the W phase, it is also possible to achieve the purpose. Because of this, the operation of the step S7 may be an operation in which the lower arm switch devices to be turned on are switched successively during the arm on period. For example, during the arm on period, the state of the inverter 13 may be switched successively one time or a plurality of times among: a state where the lower arm switch device of only the U phase is kept in the on-state; a state where the lower arm switch device of only the V phase is kept in the on-state; and a state where the lower arm switch device of only the W phase is kept in the on-state. In the meantime, the order of turning on the lower arm switch devices is not especially limited.

According to this, it is possible to make as short as possible a duration in the arm on period during which the same lower arm switch device is continuously kept in the on-state. Because of this, it is possible to curb trouble and the like caused by the same lower arm switch device being kept continuously in the on-state. For example, in a case where the insulation resistance detection operation is performed during driving of the electric vehicle, it is possible to curb a brake torque, which is caused by the same lower arm switch device being kept continuously in the on-state, to the minimum, thereby reducing a danger to and an uncomfortable feeling of the driver.

2. Second Embodiment

Next, a second embodiment is described. The description of the second embodiment focuses on a portion different from the first embodiment, and there is a case where description of a common portion is skipped.

Figure 3:
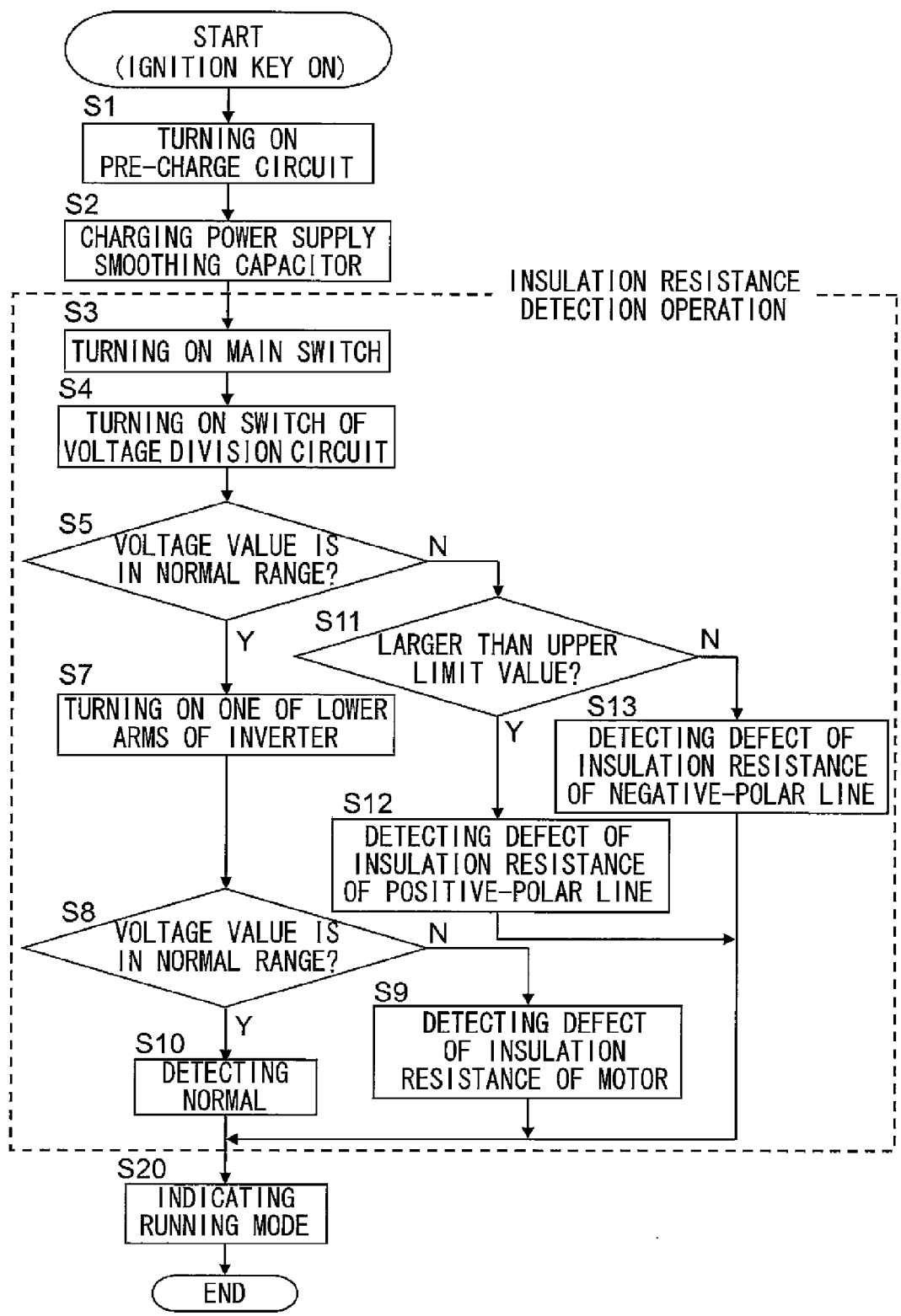
[FIG. 3] is a flow chart related to operation in a startup mode according to a second embodiment.

A flow of the operation, which is performed in the startup mode by the motor drive circuit 1 according to the present embodiment, is described with reference to a flow chart shown in FIG. 3. In the meantime, the present embodiment is different from the first embodiment in that operations (step S11 to step S13) described later are performed instead of the operation of the step S6.

In other words, the insulation resistance detection portion 16 in the present embodiment performs determination, as the operation of the step S5, of whether the voltage value Vs is in the normal range or not, thereafter, operates as follows in a case where it is determined that the voltage value Vs is outside the normal range (N in the step S5).

In a case where the voltage value Vs is larger than an upper limit value of the normal range (Y in the step S11), the insulation resistance detection portion 16 detects that the insulation resistance of the positive-polar line L1 is defective (step S12). And the insulation resistance detection portion 16 conveys this detection result to the control portion 15, and the insulation resistance detection operation is ended.

In a case where the voltage value Vs is smaller than a lower limit value of the normal range (N in the step S11), the insulation resistance detection portion 16 detects that the insulation resistance of the negative-polar line L2 is defective (step S13). And the insulation resistance detection portion 16 conveys this detection result to the control portion 15, and the insulation resistance detection operation is ended.

For example, under the reference condition described above, in a case where the defect detection threshold value for the insulation resistance is set at 50 kΩ, it is clear from FIG. 5 and FIG. 6 that a range of 0.67 V to 2.69 V becomes a normal range of the voltage value Vs. Because of this, in this case, in a case where the voltage value Vs is larger than 2.69 V (the upper limit value of the normal range), it is detected that the insulation resistance of the positive-polar line L1 is defective, while in a case where the voltage value Vs is smaller than 0.67 V (the lower limit value of the normal range), it is detected that the insulation resistance of the negative-polar line L2 is defective.

As to the insulation resistance determination of the motor device, the insulation resistance detection operation detects one of: (1) normal; (2) defective at the motor 14; (3) defective at the positive-polar line L1; and (4) defective at the negative-polar line L2.

In the meantime, after the insulation resistance detection operation is completed, the control portion 15 performs an operation in accordance with the detection result of the insulation resistance detection operation. For example, in a case where the electric vehicle is provided with an indication device (as an example, four kinds of lamps corresponding to the respective detection results of (1) to (4)) for indicating the detection result of the insulation resistance detection operation, the control portion 15 conveys the detection result to the user by performing control of the indication devices. As described above, the motor drive circuit 1 according to the present embodiment, compared with the first embodiment, locates a defective portion of the insulation resistance of the motor device in more detail, and is able to perform a more exact operation.

3. Third Embodiment

Next, a third embodiment is described. The description of the third embodiment focuses on a portion different from the first embodiment, and there is a case where description of a common portion is skipped.

Figure 4:
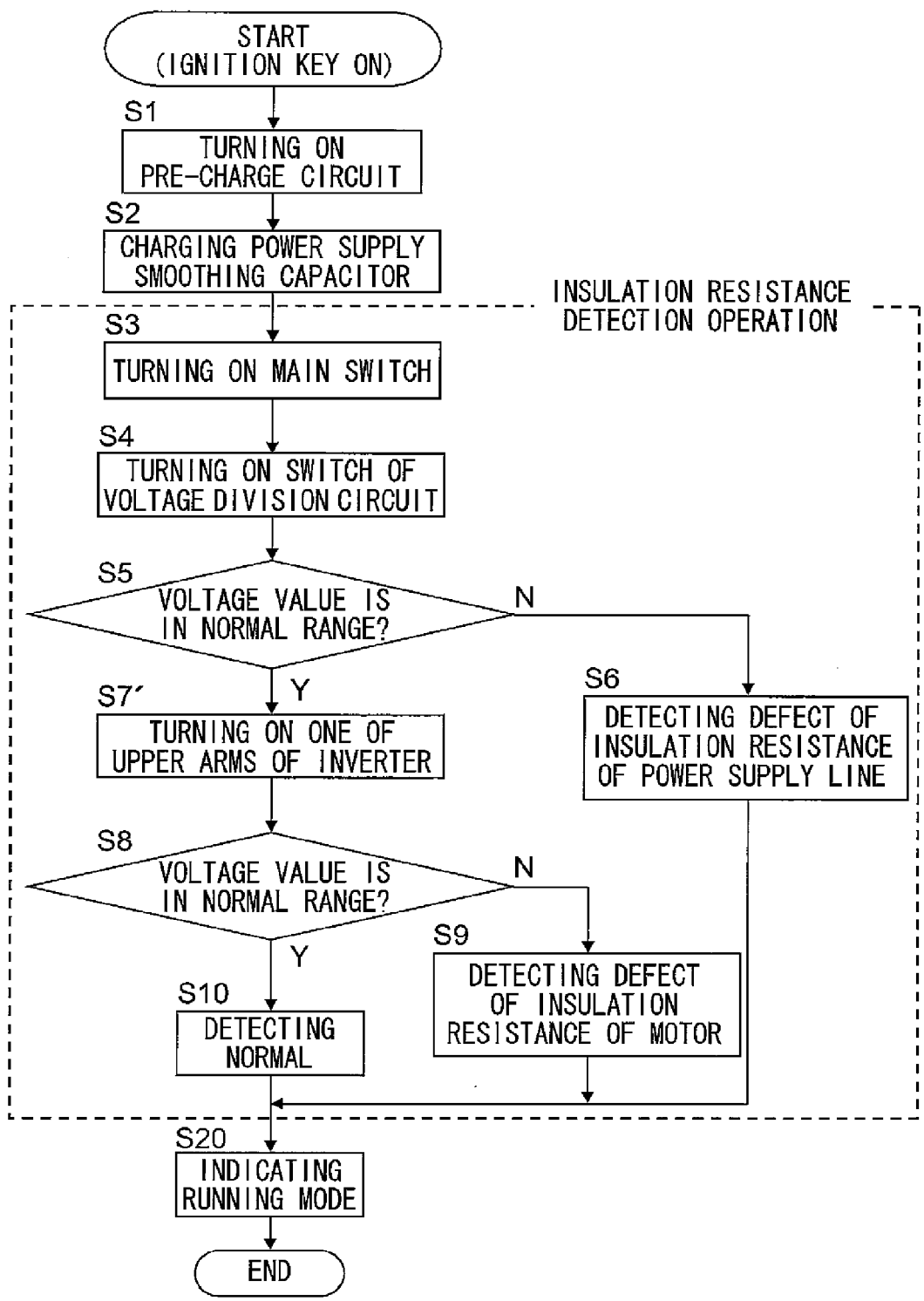
[FIG. 4] is a flow chart related to operation in a startup mode according to a third embodiment.

A flow of the operation, which is performed in the startup mode by the motor drive circuit 1 according to the present embodiment, is described with reference to a flow chart shown in FIG. 4. In the meantime, the present embodiment is different from the first embodiment in that an operation of a step S7' described later is performed instead of the operation of the step S7.

Here, when detecting whether the insulation resistance of the motor 14 is good or not (step S8 to step S10), the operation of the step S7 in the first embodiment is the operation for connecting the negative pole of the DC power supply E1 to the motor 14 by turning on one of the lower arm switch devices of the inverter 13.

The motor drive circuit 1 according to the third embodiment performs, instead of the operation of the step S7, an operation (step S7') for connecting the positive pole of the DC power supply E1 to the motor 14 by turning on one of the upper arm switch devices of the inverter 13 (the lower arm switch devices are all still kept in the off-state). As described above, by turning on the upper arm switch device instead of the lower arm switch device of the inverter 13, like in the case of the first embodiment, it is also possible to detect whether the insulation resistance of the motor 14 is good or not.

In other words, in the state where the operation of the step S7' is performed, the insulation resistance detection portion 16 determines whether the voltage value Vs is in the normal range or not (step S8).

Besides, under the reference condition described above, a relationship between the insulation resistance of the motor 14 and the voltage value Vs is as shown in a table of FIG. 8. According to the table of FIG. 8, for example, in a case where the insulation resistance of the motor 14 is 50 kΩ, the voltage value Vs becomes 2.69 V.

It is clear from FIG. 8 that for example, in a case where the defect detection threshold value for the insulation resistance is set at 50 kΩ, a range of 2.69 V or lower becomes a normal range of the voltage value Vs. If the voltage value Vs is in the normal range, the insulation resistance is normal, while if the voltage value Vs is outside the normal range (when exceeding 2.69 V), the insulation resistance is defective. As described above, according to the present embodiment, by turning on the upper arm switch device instead of the lower arm switch device of the inverter 13, it is also possible to detect whether the insulation resistance of the motor 14 is good or not.

In the meantime, in the operation of the step S7', like in the case of the operation of the step S7, during the arm on period (here, a period during which the lower arm switch device is not kept in the on-state, but one of the upper arm switch devices is kept in the on-state), the upper arm switch devices to be turned on may be switched successively. For example, during the arm on period, the state of the inverter 13 may be switched successively one time or a plurality of times among: a state where the upper arm switch device of only the U phase is kept in the on-state; a state where the upper arm switch device of only the V phase is kept in the on-state; and a state where the upper arm switch device of only the W phase is kept in the on-state. In the meantime, the order of turning on the lower arm switch devices is not especially limited.

According to this, it is possible to make as short as possible a duration in the arm on period during which the same upper arm switch device is continuously kept in the on-state. Because of this, it is possible to curb trouble and the like caused by the same upper arm switch device being kept continuously in the on-state. For example, in a case where the insulation resistance detection operation is performed during driving of the electric vehicle, it is possible to curb a brake torque, which is caused by the same upper arm switch device being kept continuously in the on-state, to the minimum, thereby reducing a danger to and an uncomfortable feeling of the driver.

Besides, also in the third embodiment, like in the case of the second embodiment, instead of the operation of the step S6, the operations of the step S11 to step S13 may be performed. According to this, the motor drive circuit 1 becomes able to locate a defective portion of the insulation resistance of the motor device in more detail, and to perform a more exact operation. In the meantime, the operation content and the like of the steps S11 to S13 are already described in the second embodiment; accordingly, here double description is skipped.

4. Others

As described above, the motor drive circuit 1 according to each embodiment includes: the DC power supply E1; the power supply lines (L1, L2) connected to the DC power supply E1; and the inverter 13 which has the group of at least one upper arm switch device and the other group of at least one lower arm switch device of the three phases connected in series between the power supply lines, and to which the motor is connected between these upper arm switch device and lower arm switch device.

And the motor drive circuit 1 includes, for the motor drive circuit 1 and the motor 14, the detection portion that detects whether the insulation resistance (insulation resistance between these parts and the chassis of the electric vehicle) is good or not. Based on the power state on the previous stage with respect to the inverter 13, the detection portion detects whether the insulation resistance is good or not, and is formed of mainly the voltage division circuit 12, the control portion 15, and the insulation resistance detection portion 16.

The detection portion performs: the operation of the step S5 (first detection operation) for detecting whether the insulation resistance of the motor device is good or not by using the output from the DC power supply E1 in the state where all of the upper arm switch devices and lower arm switch devices of the inverter 13 are kept in the off-state; and the operation of the step S8 (second detection operation) for detecting whether the insulation resistance of the motor device is good or not by using the output from the DC power supply E1 in the state where all of the upper arm switch devices of the one group or all of the lower arm switch devices of the other group are kept in the off-state and at least one of the upper arm switch devices of the one group or at least one of the lower arm switch devices of the other group is kept in the on-state.

More specifically, after it is detected by the operation of the step S5 that the insulation resistance is normal, the detection portion performs the operation of the step S8. And the detection portion detects, based on the operation of the step S5, whether the insulate resistance of the power supply line (the previous stage with respect to the inverter 13); and detects, based on the operation of the step S8, whether the insulation resistance of the motor 14 (the post stage with respect to the inverter 13) is good or not.

Because of this, according to the detection portion, it is possible to locate a defective portion of the insulation resistance.

And further, the switchover of the portion (detection portion) for detecting whether the insulation resistance is good or not is achieved by only switching the arm state of the inverter 13. Because of this, by means of a simple structure (without requiring, for each detection portion, a separate mechanism for detecting whether the insulation resistance is good or not), the detection portion is able to detect whether the insulation resistance of the motor device is good or not for each portion.

In the meantime, the voltage division circuit 12 has the plurality of voltage division resistors (R1 to R4) that are connected in series between the power supply lines, and a portion between the voltage division resistors is connected (grounded) to the chassis CH. And based on the voltage value Vs obtained by dividing the voltage by using the voltage division resistors, the detection portion detects whether the insulation resistance is good or not.

Besides, in the motor drive circuit 1 according to the second embodiment, the detection portion detects, in the first detection operation, that the insulation resistance of the positive-polar power supply line is defective when the voltage value Vs exceeds the upper limit value (first predetermined detection threshold value) of the normal range; and detects that the insulation resistance of the negative-polar power supply line is defective when the voltage value Vs is under the lower limit value (second predetermined detection threshold value) of the normal range. Because of this, it is possible to locate a defective portion of the insulation resistance of the motor device in more detail.

Besides, the second detection operation in the first embodiment is the operation for detecting the insulation resistance of the motor device by using the output from the DC power supply E1 in the state where all of the upper arm switch devices of the inverter 13 are kept in the off-state and one of the lower arm switch devices is kept in the on-state. In this case, during the execution time of the second detection operation, the detection portion is able to switch the lower arm switch devices to be turned on among the plurality of phases of the inverter 13. According to this, it is possible to curb trouble and the like caused by the same lower arm switch device being kept continuously in the on-state.

Besides, the second detection operation in the third embodiment is the operation for detecting the insulation resistance of the motor device by using the output from the DC power supply E1 in the state where all of the lower arm switch devices of the inverter 13 are kept in the off-state and one of the upper arm switch devices is kept in the on-state. In this case, during the execution time of the second detection operation, the detection portion is able to switch the upper arm switch devices to be turned on among the plurality of phases of the inverter 13. According to this, it is possible to curb trouble and the like caused by the same upper arm switch device being kept continuously in the on-state.

Besides, the motor drive circuit 1 and the motor 14 connected to the motor drive circuit form the motor device. The motor device is incorporable not only in the electric vehicle but also in other various bodies that include moving bodies. In the meantime, the moving bodies here include ships such as a motorboat and the like, vehicles such as a water toy, and further unmanned moving bodies and the like which have a motor as a drive source and people do not come aboard.

In the meantime, in a case where the insulation resistance of the motor drive circuit (power supply line and the like) is not detected but the insulation resistance of the motor is detected, even if the insulation resistance is detected defective, there is a likelihood that this detection result is caused by a defect of the insulation resistance of the motor drive circuit. In other words, in this case, there is a risk that the insulation resistance of the motor is erroneously detected. However, in the motor drive circuit according to the present embodiment, it is detected that the insulation resistance of the motor drive circuit is normal, thereafter, the insulation resistance of the motor is detected; accordingly, such erroneous detection is avoided. As described above, in the motor drive circuit according to the present embodiment, it is possible to detect the insulation resistance of the motor as exactly as possible.

Besides, as to the structure of the present invention, various modifications may be added without departing from the spirit of the present invention. In other words, it should be considered that the above embodiments are examples in all respects and are not limiting. It should be understood that the scope of the present invention is not indicated by the above description of the embodiments but by the claims, and all modifications within the scope of the claims and the meaning equivalent to the claims are covered.

Industrial Applicability

The present invention is applicable to motor drive circuits and the like incorporated in electric vehicles.

REFERENCE SIGNS LIST 1 motor drive circuit
11 pre-charge circuit
12 voltage division circuit
13 inverter
14 motor
15 control portion
16 insulation resistance detection portion
C1 power supply smoothing capacitor
CH chassis
E1 DC power supply
R0 resistor
R1 to R4 resistors (voltage division resistors)
S0 to S3 switch devices
S11 switch device (upper arm switch device of U phase)
S12 switch device (lower arm switch device of U phase)
S21 switch device (upper arm switch device of V phase)
S22 switch device (lower arm switch device of V phase)
S31 switch device (upper arm switch device of W phase)
S32 switch device (lower arm switch device of W phase)

The invention claimed is:
1. A motor drive circuit comprising:
a DC power supply;
power supply lines connected to the DC power supply; and
an inverter which has a group of at least one upper arm switch device and another group of at least one lower arm switch device of one phase or of a plurality of phases connected in series between the power supply lines, and to which a motor is connected between the upper arm switch device and the lower arm switch device;
the motor drive circuit includes a detection portion that detects insulation resistances of the motor drive circuit and the motor based on a power state on a previous stage with respect to the inverter, wherein
the detection portion performs: a first detection operation for detecting the insulation resistance by using an output from the DC power supply in a state where all of the upper arm switch devices and all of the lower arm switch devices are kept in an off-state; and
a second detection operation for detecting the insulation resistance by using the output from the DC power supply in a state where all of the upper arm switch devices of the one group or all of the lower arm switch devices of the other group are kept in the off-state and at least one of the upper arm switch devices of the one group or at least one of the lower arm switch devices of the other group is kept in an on-state.

2. The motor drive circuit according to claim 1, wherein
the detection portion performs the second detection operation after it is detected by the first detection operation that the insulation resistance is normal,
detects, based on the first detection operation, whether the insulation resistance on the previous stage with respect to the inverter is good or not, and
detects, based on the second detection operation, whether the insulation resistance on a post stage with respect to the inverter is good or not.

3. The motor drive circuit according to claim 2, including a plurality of voltage division resistors connected in series between the power supply lines;
a portion between the voltage division resistors is grounded; and
based on a voltage value obtained by dividing a voltage by using the voltage division resistors, the detection portion detects whether the insulation resistance is good or not.

4. The motor drive circuit according to claim 3, wherein
in the first detection operation,
the detection portion detects that the insulation resistance of the power supply line on a positive-polar side is defective when the voltage value exceeds a first predetermined detection threshold value, and
detects that the insulation resistance of the power supply line on a negative-polar side is defective when the voltage value is under a second predetermined detection threshold value.

5. The motor drive circuit according to claim 2, wherein
the inverter includes the at least one upper arm switch device and at least one lower arm switch device of the plurality of phases;
the second detection operation is an operation in which the insulation resistance is detected by using the output from the DC power supply in a state where all of the upper arm switch devices are kept in an off-state and one of the lower arm switch devices is kept in an on-state; and
the detection portion switches the lower arm switch devices to be turned on among the plurality of phases during an execution time of the second detection operation.

6. The motor drive circuit according to claim 2, wherein
the inverter includes the at least one upper arm switch device and at least one lower arm switch device of the plurality of phases;
the second detection operation is an operation in which the insulation resistance is detected by using the output from the DC power supply in a state where all of the lower arm switch devices are kept in an off-state and one of the upper arm switch devices is kept in an on-state; and
the detection portion switches the upper arm switch devices to be turned on among the plurality of phases during an execution time of the second detection operation.

7. A motor device comprising:
the motor drive circuit according to claim 1; and
a motor connected between the upper arm switch device and the lower arm switch device.

8. A moving body comprising the motor device according to claim 7.

* * * * *